(12) United States Patent
Yamazaki et al.

(10) Patent No.: US 10,529,918 B2
(45) Date of Patent: Jan. 7, 2020

(54) MANUFACTURING METHOD OF SEMICONDUCTOR DEVICE HAVING MAGNETIC SUBSTANCE FILM

(71) Applicant: TOKYO ELECTRON LIMITED, Tokyo (JP)

(72) Inventors: Mitsuru Yamazaki, Oshu (JP); Koji Yamashita, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 43 days.

(21) Appl. No.: 15/263,942

(22) Filed: Sep. 13, 2016

(65) Prior Publication Data

US 2017/0077396 A1 Mar. 16, 2017

(30) Foreign Application Priority Data

Sep. 16, 2015 (JP) .................................. 2015-182659

(51) Int. Cl.
| | | |
|---|---|---|
| *H01L 43/12* | (2006.01) | |
| *F27B 3/08* | (2006.01) | |
| *F27D 7/06* | (2006.01) | |
| *F27B 5/04* | (2006.01) | |
| *F27D 11/12* | (2006.01) | |
| *F27D 19/00* | (2006.01) | |
| *F27D 21/00* | (2006.01) | |

(52) U.S. Cl.
CPC ................ *H01L 43/12* (2013.01); *F27B 3/08* (2013.01); *F27B 5/04* (2013.01); *F27D 7/06* (2013.01); *F27D 11/12* (2013.01); *F27D 19/00* (2013.01); *F27D 21/00* (2013.01)

(58) Field of Classification Search
CPC . H01L 43/12; H01L 43/08; F27B 3/08; F27B 5/04; F27D 11/12; F27D 19/00; F27D 21/00; F27D 7/06
See application file for complete search history.

(56) References Cited

U.S. PATENT DOCUMENTS

| | | | |
|---|---|---|---|
| 6,010,755 A * | 1/2000 | Suzuki .................. | C23C 16/511 118/723 MA |
| 2003/0228494 A1* | 12/2003 | Ihara ........................ | G11B 5/64 428/842 |
| 2007/0231460 A1* | 10/2007 | Ukigaya ............... | C23C 14/042 427/8 |
| 2013/0300040 A1* | 11/2013 | Moffatt ................ | C21D 9/0006 266/249 |

FOREIGN PATENT DOCUMENTS

| | | |
|---|---|---|
| JP | 200414056 A | 1/2004 |
| JP | 2004-263206 A | 9/2004 |
| JP | 2014183279 A | 9/2014 |

\* cited by examiner

*Primary Examiner* — Duy T Nguyen
(74) *Attorney, Agent, or Firm* — Nath, Goldberg & Meyer; Jerald L. Meyer

(57) ABSTRACT

There is provided a semiconductor device manufacturing method which includes: loading a substrate with a magnetic substance film formed thereon into a process container; regulating an internal pressure of the process container to a first pressure lower than an atmospheric pressure; regulating the internal pressure of the process container from the first pressure to a second pressure higher than the first pressure; and magnetizing the magnetic substance film by applying a magnetic field to the magnetic substance film under the second pressure.

8 Claims, 4 Drawing Sheets

MANUFACTURING METHOD OF SEMICONDUCTOR DEVICE HAVING MAGNETIC SUBSTANCE FILM

CROSS-REFERENCE TO RELATED APPLICATION

This application claims the benefit of Japanese Patent Application No. 2015-182659, filed on Sep. 16, 2015, in the Japan Patent Office, the disclosure of which is incorporated herein in its entirety by reference.

TECHNICAL FIELD

The present disclosure relates to a semiconductor device manufacturing method.

BACKGROUND

A Magnetic Random Access Memory (MRAM), which is one type of non-volatile memory, is getting a lot of attention as a semiconductor memory device. For example, the MRAM is manufactured by performing a heat treatment (magnetic annealing treatment) on a magnetic substance film formed on a semiconductor wafer (hereinafter, referred to as a "wafer") by a magnetic field within a process container kept at a high vacuum such that a magnetic property of the magnetic substance film is developed.

In recent years, in a semiconductor manufacturing apparatus, as an element is becoming denser, a more dense treatment is requested. For that reason, it has become important to reduce the adhesion of particles onto a surface of a wafer. However, if a magnetic annealing treatment is performed within a process container kept at a high vacuum, there is a case in which the adhesion of particles onto the surface of the wafer cannot be sufficiently reduced.

SUMMARY

Some embodiments of the present disclosure provide a semiconductor device manufacturing method which is capable of reducing the adhesion of particles onto a surface of a substrate.

According to one embodiment of the present disclosure, there is provided a semiconductor device manufacturing method which includes: loading a substrate with a magnetic substance film formed thereon into a process container; regulating an internal pressure of the process container to a first pressure lower than an atmospheric pressure; regulating the internal pressure of the process container from the first pressure to a second pressure higher than the first pressure; and magnetizing the magnetic substance film by applying a magnetic field to the magnetic substance film under the second pressure.

According to another embodiment of the present disclosure, there is provided a semiconductor device manufacturing method which includes: loading a substrate with a magnetic substance film formed thereon into a process container; regulating an internal pressure of the process container to fall within a range of 0.1 Pa to 100 kPa; and magnetizing the magnetic substance film by applying a magnetic field to the magnetic substance film in a state where the internal pressure of the process container is kept within the range of 0.1 Pa to 100 kPa.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
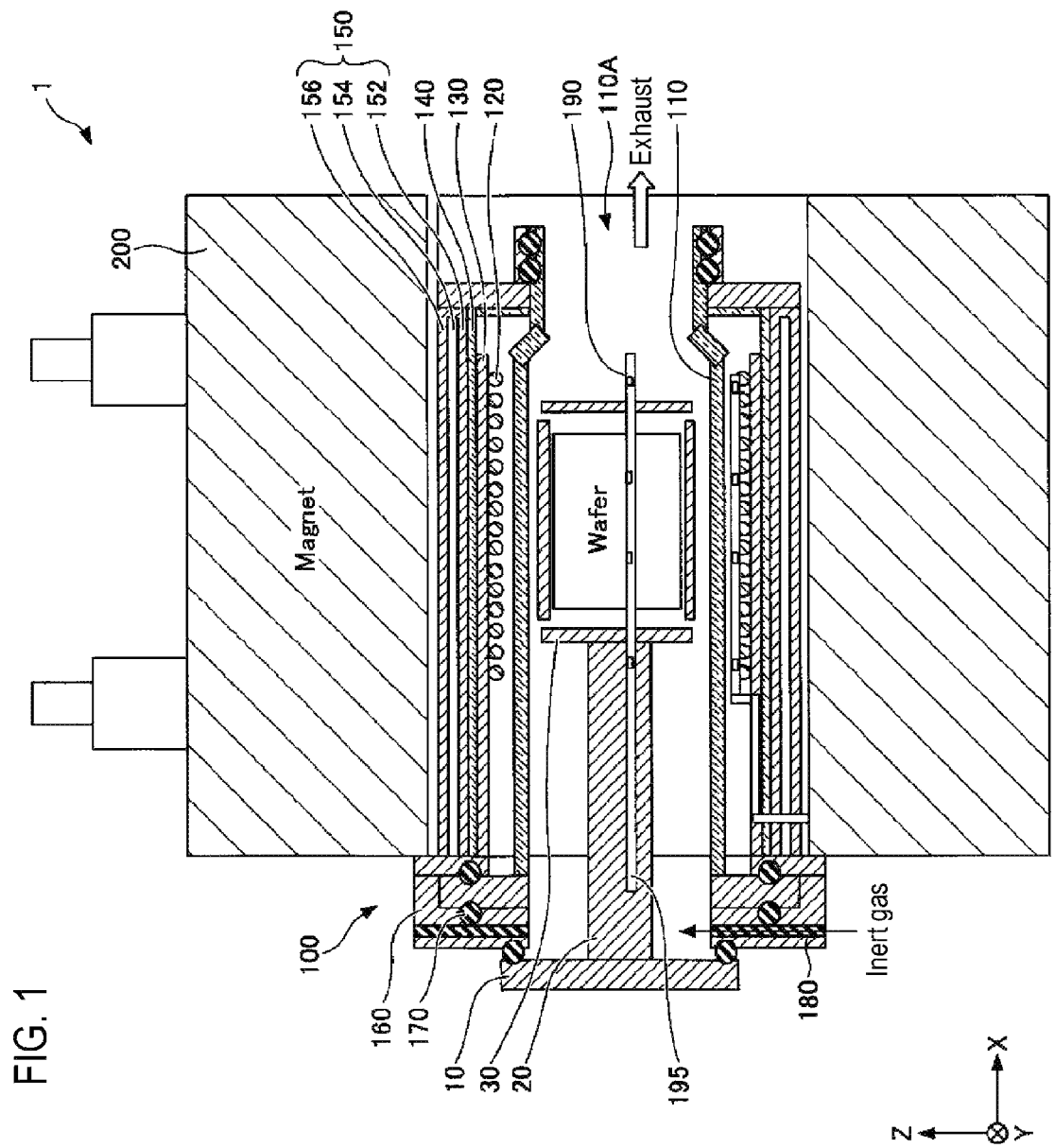
FIG. 1 is a schematic sectional view of a magnetic annealing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In addition, in the specification and drawings, like reference numerals will be assigned to like parts having substantially the same functions and duplicate descriptions thereof will be omitted.

Now, a magnetic annealing apparatus that can be properly used for a semiconductor device manufacturing method according to an embodiment of the present disclosure will be described with reference to FIG. 1. FIG. 1 is a schematic sectional view of a magnetic annealing apparatus of this embodiment. Hereinafter, in the magnetic annealing apparatus, a front-back direction, a left-right direction and an up-down direction will be referred to as an X-direction, a Y-direction, and a Z-direction, respectively.

As illustrated in FIG. 1, the magnetic annealing apparatus 1 includes an annealing furnace 100 and a magnet 200. For example, the magnet 200 is installed to cover an outer peripheral surface of the annealing furnace 100, which extends in the front-back direction (longitudinal direction) of the annealing furnace 100. Various kinds of magnets may be used as the magnet 200 as long as they can induce a uniform magnetic field biased to a predetermined direction (e.g., the front-back direction) with respect to a region where wafers W are held in the annealing furnace 100. As an example, a solenoid type magnet may be used as the magnet 200.

The annealing furnace 100 includes a process container 110, a heater 120, a heater support metal plate 130, a heat insulating member 140, a water cooling jacket 150, a flange part 160, an O-ring 170, a gas supply tube 180, a thermocouple 190, and a quartz pipe 195. In addition, the annealing furnace 100 is configured to accommodate a cap 10, a wafer boat supporting member 20 and a wafer boat 30 within the process container 110.

Figure 2A:
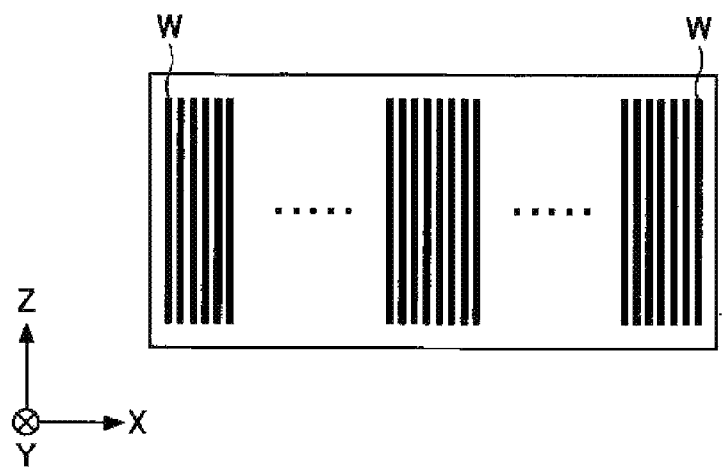
FIGS. 2A and 2B are schematic side views illustrating a state where wafers are arranged.
Figure 2B:
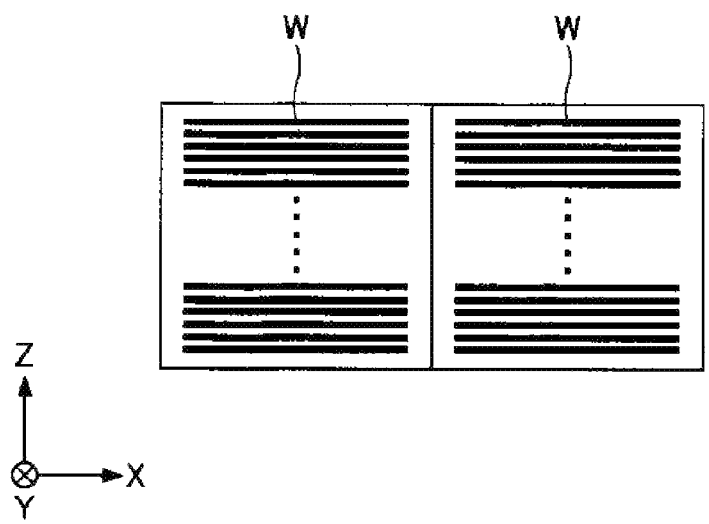

The wafer boat 30 will be described with reference to FIGS. 2A and 2B. FIGS. 2A and 2B are schematic side views illustrating a state where the wafers are arranged.

The wafer boat 30 is an example of a substrate holder which is capable of holding the wafers W. The wafer W is an example of a substrate. Various kinds of wafer boats may be used as the wafer boat 30 as long as they can hold the wafers W. As an example, as illustrated in FIG. 2A, the wafer boat 30 may have a configuration in which a plurality of wafers W, each being arranged in a vertical posture, is held in a mutually spaced-apart relationship along the front-back direction (the X-direction). In some embodiments, as illustrated in FIG. 2B, the wafer boat 30 may have a configuration in which a plurality of wafers W, each being arranged in a horizontal posture, is held in a mutually spaced-apart relationship along the up-down direction (the Z-direction).

As illustrated in FIG. 1, the process container 110 is a container that accommodates the wafer boat 30 to perform the magnetic annealing treatment. The process container 110 has a horizontally-extending tubular shape. The process container 110 may be configured in any shape as long as it can be formed in a horizontally-extending tubular shape and is capable of accommodating the wafer boat 30. As an example, the process container 110 may be configured in a cylindrical shape. In some embodiments, the process container 110 may be configured as, for example, a quartz tube formed of quartz.

The heater 120 is a means for heating the wafers W and is installed outside the process container 110. The heater 120 has a length longer than that of the wafer boat 30 so as to cover the wafer boat 30 in the front-back direction (the longitudinal direction) of the process container 110. The heater 120 is installed along the longitudinal direction to cover a surface of the process container 110, which extends in the longitudinal direction.

The heater support metal plate 130 is a metal plate for supporting the heater 120. The heater 120 is installed on an inner peripheral surface of the heater support metal plate 130.

The heat insulating member 140 is a member for confining heat radiated from the heater 120 to prevent the heat from being discharged where the magnet 200 is installed. The heat insulating member 140 is installed to cover an outer peripheral surface of the heater support metal plate 130.

The water cooling jacket 150 is installed to prevent a temperature of the annealing furnace 100 from excessively raising. The water cooling jacket 150 is installed to cover an outer peripheral surface of the heat insulating member 140. The water cooling jacket 150 includes an inner double tube 152 and an outer double tube 156. A coolant 154 flows through a gap between the inner double tube 152 and the outer double tube 156. The coolant 154 may be, for example, cold water, or may be another kind of a coolant. The installation of the water cooling jacket 150 makes it possible to prevent a large quantity of heat from being radiated toward the magnet 200.

The flange part 160 is a structure installed to properly fix the process container 110, and holds the process container 110 through an O-ring 170. The O-ring 170 may be installed at other locations as needed so as to hermetically seal and fix the other locations.

The gas supply tube 180 is a means for supplying an inert gas (e.g., a nitrogen ($N_2$) gas) into the process container 110, and is installed to penetrate from an outer peripheral surface of the flange part 160 up to the inner peripheral surface thereof.

The thermocouple 190 is a temperature detection means for measuring a temperature around the wafers W within the process container 110. The thermocouple 190 is installed to perform temperature control as needed. In addition, the thermocouple 190 may be disposed, for example, within the quartz pipe 195.

An opening 110A is formed inward of the process container 110 at a leading end side (side opposite to the cap 10) of the wafer boat 30. The opening 110A is coupled to a vacuum pump through an exhaust tube (not illustrated). Various kinds of vacuum pumps may be used as the vacuum pump as long as they can evacuate the inside of the process container 110. As an example, a dry pump or a turbo molecular pump may be used as the vacuum pump. In addition, a pressure regulating valve (not illustrated) is installed in the exhaust tube. By regulating an opening degree of the pressure regulating valve, it is possible to regulate an internal pressure of the process container 110.

First Embodiment

Figure 3:
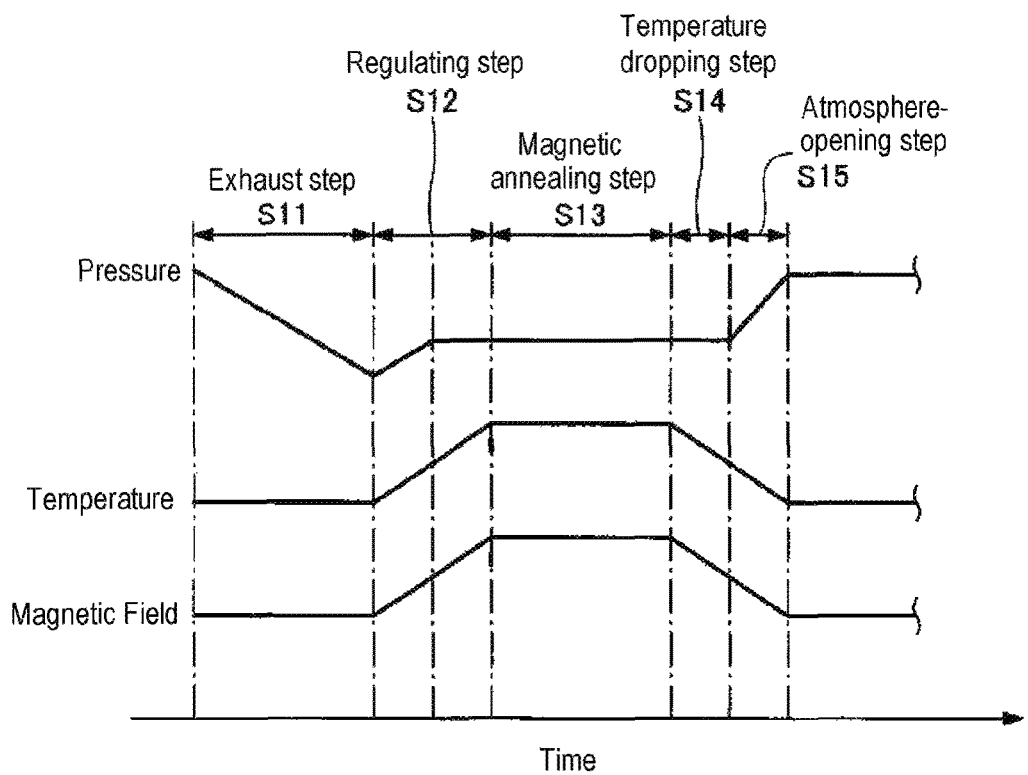
FIG. 3 is a time chart illustrating a semiconductor device manufacturing method according to a first embodiment of the present disclosure.

Next, an example of a semiconductor device manufacturing method according to an embodiment of the present disclosure will be described with reference to FIG. 3. FIG. 3 is a time chart illustrating a semiconductor device manufacturing method of a first embodiment.

First, the wafer boat 30 is loaded into the process container 110 (in a loading step; not illustrated). For example, as illustrated in FIG. 2A, the plurality of wafers W, each being arranged in a vertical posture, is held inside the wafer boat 30 in a mutually spaced-apart relationship along the front-back direction. A predetermined magnetic substance film is formed on each of the wafers W in advance.

Subsequently, in an exhaust step S11, the inside of the process container 110 is evacuated by the vacuum pump so that the inside of the process container 110 is brought into a high vacuum. The term "high vacuum" used herein refers to a vacuum state whose pressure falls within a range of 10 µPa to 0.1 Pa ($10^{-5}$ Pa to $10^{-1}$ Pa). The pressure range of 10 µPa to 0.1 Pa is an example of a first pressure. In the exhaust step S11, the inside of the process container 110 may be evacuated in the state where no gas is supplied from the gas supply tube 180, or the inside of the process container 110 may be evacuated while supplying the inert gas from the gas supply tube 180.

Subsequently, in a regulating step S12, the internal pressure of the process container 110, the temperature of the wafer W, and the magnetic field within the process container 110 are regulated. Specifically, the heater 120 is controlled such that the temperature of the wafers W is regulated to 150 degrees C. to 450 degrees C. In addition, the magnet 200 is controlled such that the magnetic field within the process container 110 is regulated to 1 T to 7 T. In addition, the inert gas of a predetermined flow rate is supplied from the gas supply tube 180 and the opening degree of the pressure regulating valve is regulated such that the inside of the process container 110 is changed from the high vacuum to a medium vacuum or a low vacuum. The term "medium vacuum" used herein refers to a vacuum state whose pressure falls within a range of 0.1 Pa to 100 Pa ($10^{-1}$ Pa to $10^2$ Pa). The term "low vacuum" refers to a vacuum state whose pressure falls within a range of 100 Pa to 100 kPa ($10^2$ Pa to $10^5$ Pa). In addition, the pressure range of $10^{-1}$ Pa to $10^5$ Pa is an example of a second pressure.

As described above, in the semiconductor device manufacturing method of this embodiment, the inside of the process container 110 is regulated to a high vacuum in the exhaust step S11, and then, a pressure regulation operation of regulating the inside of the process container 110 to a medium vacuum or a low vacuum in the regulating step S12.

Subsequently, in a magnetic annealing step S13, the magnetic annealing treatment is performed on the magnetic substance film formed on each of the wafers W in the state where the inside of the process container 110 is maintained at the medium vacuum or the low vacuum. This allows a desired magnetic property to be expressed in the magnetic substance film. Specifically, under conditions applied in the regulating step S12, that is to say, the conditions in which the inside of the process container 110 is regulated to the medium vacuum or the low vacuum, the temperature of the wafers W is 150 degrees C. or 450 degrees C., and the magnetic field is 1 T to 7 T, the magnetic annealing treatment is performed on the wafers W for a period of time of 1 minute to 120 minutes.

As described above, in the semiconductor device manufacturing method of this embodiment, the magnetic annealing treatment is performed on the wafers W in the state where the inside of the process container 110 is maintained at the medium vacuum or the low vacuum in the magnetic annealing step S13. Thus, it is possible to reduce the adhesion of particles onto the surfaces of the wafers W, compared to a case where the magnetic annealing treatment is performed on the magnetic substance film formed on each of the wafers W in the state where the inside of the process container 110 is maintained at the high vacuum. Details thereof will be described with reference to examples to be described later.

In addition, the plurality of wafers W, each being arranged in a vertical posture, is held in the wafer boat 30 in a mutually spaced-apart relationship along the front-back direction. As such, a plane surface of a film of each of the wafers W becomes perpendicular to the direction of the magnetic field. Thus, the magnetic substance film formed on each of the wafers W is magnetized in a direction perpendicular to the magnetic substance film.

In addition, as illustrated in FIG. 2B, in the case where the plurality of wafers W, each being arranged in a horizontal posture, is held in the wafer boat 30 in a mutually spaced-apart relationship along the up-down direction, a plane surface of a film of each of the wafers W becomes parallel to the direction of the magnetic field. Thus, the magnetic substance film formed on each of the wafers W is magnetized in a direction of the plane surface (in-plane direction).

Subsequently, in a temperature dropping step S14, the heater 120 is turned off, and the magnet 200 is turned off. Thus, the temperature of the wafers W is gradually dropped, and the magnetic field applied to the wafers W is gradually reduced.

Thereafter, in an atmosphere-opening step S15, the exhaust of the inside of the process container 110 by the vacuum pump is stopped and the inert gas is supplied from the gas supply tube 180 into the process container 110 so that the inside of the process container 110 is opened to the atmosphere. After the internal pressure of the process container 110 is changed to the atmospheric pressure, the wafer boat 30 is unloaded from the inside of the process container 110. In addition, the atmosphere-opening step S15 is initiated after the temperature of the wafers W is dropped to a predetermined temperature in the temperature dropping step 14.

In this way, it is possible to allow desired magnetic properties to be expressed in the magnetic substance film formed on each of the wafers W.

Next, an example of the semiconductor device manufacturing method according to this embodiment will be described. In this example, in the state where 100 wafers W, each being arranged in a vertical posture, are held in the wafer boat 30 in a mutually spaced-apart relationship along the front-back direction, a magnetic annealing treatment was performed. As conditions of the magnetic annealing treatment, the temperature of the wafer W was set to about 400 degrees C., the magnetic field within the process container 110 was set to several T, and a process time was set to about 1 hour.

In addition, the internal pressure of the process container 110 was set to about $10^{-1}$ Pa, about $3 \times 10^2$ Pa, and about $10^4$ Pa. In this example, the internal pressure of the process container 110 in the magnetic annealing step S13 was regulated to about $10^{-1}$ Pa by depressurizing the inside of the process container 110 up to the ultimate pressure of a dry pump. In addition, in the state where the inside of the process container 110 is exhausted by the dry pump, the inert gas was supplied from the gas supply tube 180 and the opening degree of the pressure regulating valve was regulated. Thus, the internal pressure of the process container 110 in the magnetic annealing step S13 was regulated to about $3 \times 10^2$ Pa or about $10^4$ Pa.

Further, in a comparative example, in the state where 100 wafers W, each being arranged in a vertical posture, are held in the wafer boat 30 in a mutually spaced-apart relationship along the front-back direction, a magnetic annealing treatment was performed under a condition that the internal pressure of the process container 110 is about $10^{-5}$ Pa. Conditions of a temperature, a magnetic field and a process time in this magnetic annealing treatment were set to be similar to those in the example. In the comparative example, the internal pressure of the process container 110 in the magnetic annealing step was regulated to about $10^{-5}$ Pa by depressurizing the inside of the process container 110 up to the ultimate pressure of a turbo molecular pump.

Subsequently, measurement was performed to check the number of particles adhered onto the surface of each of the wafers W, which is obtained by this example and the comparative example.

Figure 4:
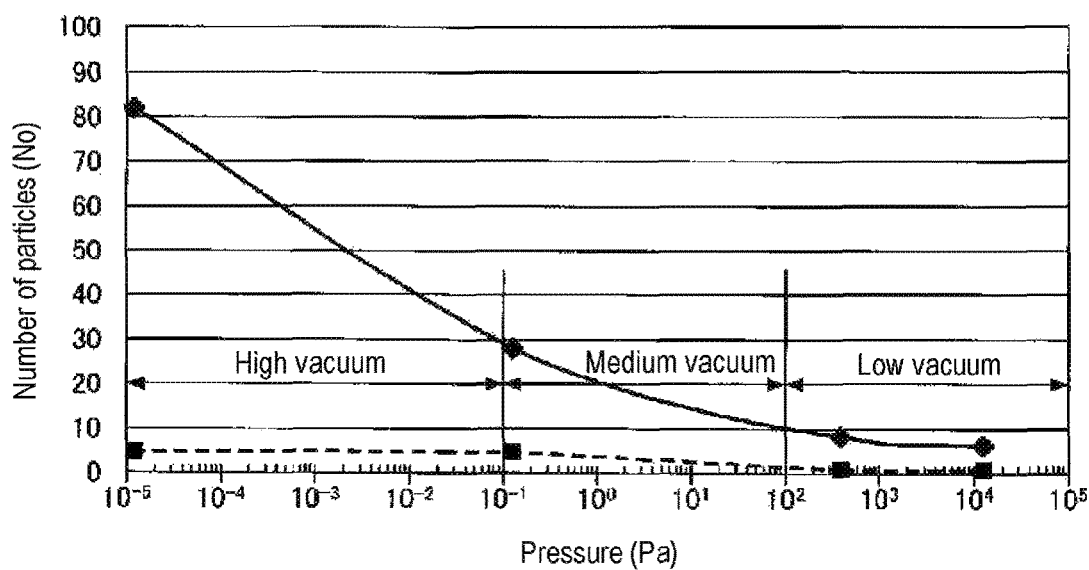
FIG. 4 is a graph illustrating a relationship between an internal pressure of a process container and the number of particles adhered onto a surface of a wafer.

Measurement results will be described with reference to FIG. 4. FIG. 4 is a graph illustrating a relationship between an internal pressure of a process container and the number of particles adhered onto a surface of a wafer. In FIG. 4, the horizontal axis represents the internal pressure (Pa) of the process container in the magnetic annealing step, and the vertical axis represents the number of particles (No) adhered onto the surface of the wafer after the magnetic annealing treatment.

In addition, in FIG. 4, a rhombic mark indicates the number of particles in a wafer whose number of adhered particles is largest among the 100 wafers (hereinafter, referred to as a "maximum value of particle number"). Further, in FIG. 4, a square mark indicates an average value of the number of particles adhered onto each of the 100 wafers (hereinafter, referred to as an "average value of particle number"). Furthermore, in this embodiment, the number of particles of which a grain size is larger than 0.1 μm, was measured.

As indicated by the rhombic marks in FIG. 4, it was found that the maximum value of particle number is reduced by setting the internal state of the process container 110 in the magnetic annealing step to the medium vacuum or the low vacuum. Specifically, it was found that, by setting the internal pressure of the process container 110 to about $10^{-1}$ Pa in the magnetic annealing step, the maximum value of particle number is reduced to a half or less compared to the case where the internal pressure was about $10^{-5}$ Pa. In addition, it was found that, by setting the internal pressure of the process container 110 to about $3 \times 10^2$ Pa in the magnetic annealing step, the maximum value of particle number is reduced by a factor of 10 or less compared to the case where the internal pressure was about $10^{-5}$ Pa. Further, it was found that, by setting the internal pressure of the process container 110 to about $10^4$ Pa in the magnetic annealing step, the maximum value of particle number is reduced by a factor of 10 or less compared to the case where the internal pressure was about $10^{-5}$ Pa.

As indicated by the square marks in FIG. 4, it was found that, by setting the internal state of the process container 110 in the magnetic annealing step to the low vacuum, the average value of particle number is reduced to substantially zero.

In addition, the magnetic properties of an MRAM manufactured using a magnetic substance film of this example were equivalent to those of an MRAM manufactured using a magnetic substance film of the comparative example.

As described above, the semiconductor device manufacturing method according to the first embodiment of the present disclosure performs the magnetic annealing treatment by: regulating the inside of the process container 110 to the high vacuum; regulating the inside of the process container to the medium vacuum or the low vacuum; and applying a magnetic field to the wafers W in the state where the inside of the process container 110 is kept in the medium vacuum or the low vacuum. It is therefore possible to suppress the particles from adhering onto the surface of the wafer W. This improves the yield of the MRAM manufactured using the magnetic substance film. In addition, this eliminates the need for a process of removing the particles adhered onto the surface of the wafer W after the magnetic annealing treatment.

Second Embodiment

Figure 5:
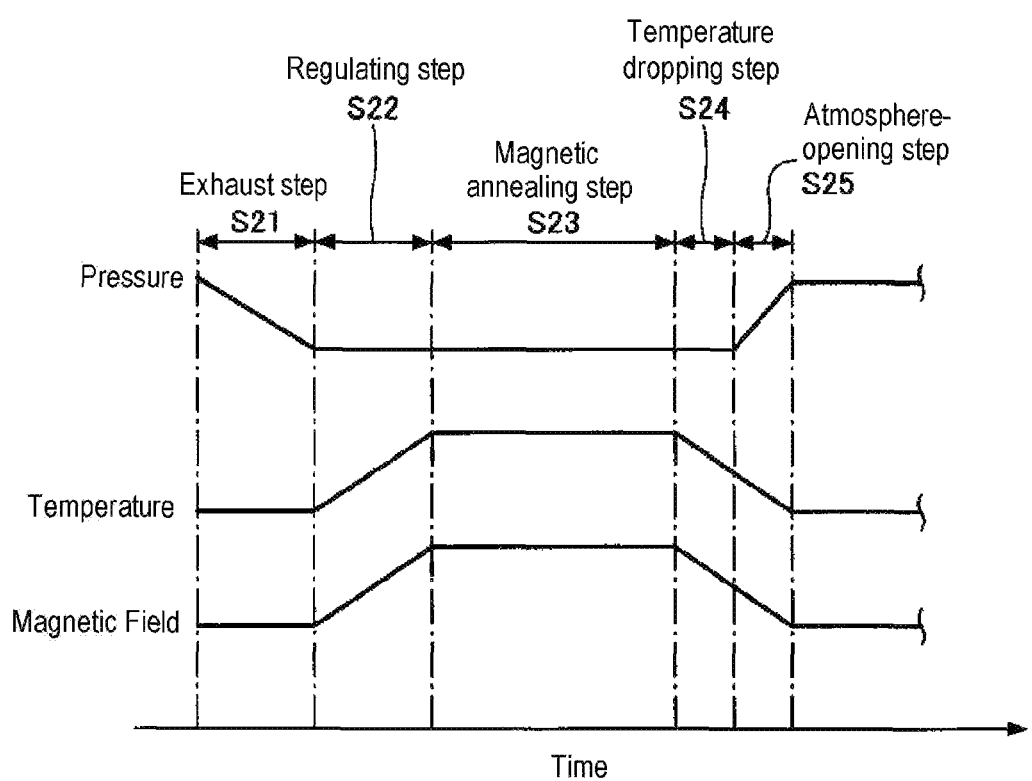
FIG. 5 is a time chart illustrating a semiconductor device manufacturing method according to a second embodiment of the present disclosure.

Next, another example of the semiconductor device manufacturing method will be described with reference to FIG. 5. FIG. 5 is a time chart illustrating a semiconductor device manufacturing method according to a second embodiment of the present disclosure.

The semiconductor device manufacturing method of the second embodiment is different from the semiconductor device manufacturing method of the first embodiment in that the inside of a process container is regulated to a medium vacuum or a low vacuum while bypassing a high vacuum, and subsequently, a magnetic annealing treatment is performed on a magnetic substance film formed on a wafer.

First, the wafer boat 30 is loaded into the process container 110 (in a loading step; not illustrated). For example, as illustrated in FIG. 2A, a plurality of wafers W, each being arranged in a vertical posture, is held in the wafer boat 30 in a mutually spaced-apart relationship along the front-back direction. A predetermined magnetic substance film is formed on each of the wafers W in advance.

Subsequently, in an exhaust step S21, the inside of the process container 110 is exhausted by a vacuum pump so that the inside of the process container 110 is brought into a medium vacuum or a low vacuum. In the exhaust step S21, the inside of the process container 110 may be exhausted without supplying an inert gas from the gas supply tube 180. Alternatively, the inside of the process container 110 may be exhausted while supplying the inert gas from the gas supply tube 180.

As described above, in the semiconductor device manufacturing method of this embodiment, it is possible to reduce the adhesion of particles onto the surface of the wafer W even if the inside of the process container 110 is directly brought into the medium vacuum or the low vacuum in the exhaust step S21.

Subsequently, in a regulating step S22, a temperature of the wafer W and a magnetic field within the process container 110 are regulated while keeping the inside of the process container 110 at the medium vacuum or the low vacuum. Specifically, the heater 120 is controlled such that the temperature of the wafer W is regulated to fall within a range of 150 degrees C. to 450 degrees C. In addition, the magnet 200 is controlled such that the magnetic field within the process container 110 is regulated to fall within a range of 1 T to 7 T. In addition, the opening degree of the pressure regulating valve is regulated such that the inside of the process container 110 is kept at the medium vacuum or the low vacuum. In some embodiments, in the regulating step S22, the inside of the process container 110 may be kept at the medium vacuum or the low vacuum by exhausting the inside of the process container 110 while supplying the inert gas of a predetermined flow rate from the gas supply tube 180 to the process container 110.

Subsequently, in a magnetic annealing step S23, a magnetic annealing treatment is performed on a magnetic substance film formed on each of the wafers W in the state where the inside of the process container 110 is kept at the medium vacuum or the low vacuum. This allows desired magnetic properties to be expressed in the magnetic substance film. Specifically, under conditions applied in the regulating step S22, that is to say, under conditions that the inside of the process container 110 is kept at the medium vacuum or the low vacuum, the temperature of the wafers W falls within the range of 150 degrees C. or 450 degrees C., and the magnetic field falls within the range of 1 T to 7 T, the magnetic annealing treatment is performed on the wafers W for a period of time of 1 minute to 120 minutes. It is therefore possible to reduce the adhesion of particles onto the surface of each of the wafers W, compared to a case where the magnetic annealing treatment is performed on the magnetic substance film formed on each of the wafers W while keeping the inside of the process container 110 at the high vacuum.

In addition, the plurality of wafers W, each being arranged in a vertical posture, is held in the wafer boat 30 in a mutually spaced-apart relationship along the front-back direction. Thus, a plane surface of each of the wafers W becomes perpendicular to the direction of the magnetic field. Therefore, the magnetic substance film formed on each of the wafers W is magnetized in a direction perpendicular to the magnetic substance film.

Further, as illustrated in FIG. 2B, in the case where the plurality of wafers W, each being arranged in a horizontal posture, is held in the wafer boat 30 in a mutually spaced-apart relationship along the up-down direction, the plane surface of each of the wafers W becomes parallel to the direction of the magnetic field. Thus, the magnetic substance film formed on each of the wafers W is magnetized in a direction of the plane surface (in-plane direction).

Subsequently, in a temperature dropping step S24, the heater 120 is turned off, and the magnet 200 is turned off. Thus, the temperature of the wafers W is gradually dropped, and the magnetic field applied to the wafers W is gradually reduced.

Thereafter, in an atmosphere-opening step S25, the exhaust of the inside of the process container 110 by the vacuum pump is stopped and the inert gas is supplied from the gas supply tube 180 into the process container 110 so that the inside of the process container 110 is opened to the atmosphere. After the internal pressure of the process container 110 becomes the atmospheric pressure, the wafer boat 30 is unloaded from the inside of the process container 110. In addition, the atmosphere-opening step S25 is initiated after the temperature of the wafers W is dropped to a predetermined temperature by the temperature dropping step 24.

This configuration allows desired magnetic properties to be expressed in the magnetic substance film formed on each of the wafers W.

The semiconductor device manufacturing method of this embodiment performs the magnetic annealing treatment by directly regulating the inside of the process container 110 to the medium vacuum or the low vacuum while bypassing the high vacuum, and applying the magnetic field to each of the wafers W while keeping the inside of the process container 110 at the medium vacuum or the low vacuum. It is therefore possible to reduce the adhesion of particles onto the surface of each of the wafers W. This improves the yield of an MRAM manufactured using the magnetic substance film. In addition, this eliminates the need for a process of removing the particles adhered onto the surface of each of the wafers W after the magnetic annealing treatment.

In particular, according to the semiconductor device manufacturing method of this embodiment, it is possible to omit the step of exhausting the process container 110 to obtain the high vacuum. This reduces a period of time required for process. Furthermore, since the vacuum pump such as the turbo molecular pump that exhausts the inside of the process container 110 to obtain the high vacuum is not required, it is possible to simplify the apparatus.

According to the present disclosure in some embodiments, it is possible to reduce the adhesion of particles onto a surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method comprising:

loading a substrate with a magnetic substance film formed thereon into a process container of a magnetic annealing apparatus, the substrate being arranged in a direction selected between a vertical posture or a horizontal posture in the process container;

regulating an internal pressure of the process container to a first pressure that is lower than an atmospheric pressure;

regulating the internal pressure of the process container from the first pressure to a second pressure that is higher than the first pressure; and magnetizing the magnetic substance film in the process container of the magnetic annealing apparatus by applying a magnetic field to the magnetic substance film under the second pressure such that when the substrate is arranged in the vertical posture, the magnetic substance film of the substrate is magnetized in a direction perpendicular to the magnetic substance film, and when the substrate is arranged in the horizontal posture, the magnetic substance film of the substrate is magnetized in a direction parallel with the magnetic substance film, wherein the regulating the internal pressure of the process container from the first pressure to the second pressure includes regulating a temperature of the substrate and the magnetic field within the process container, and wherein the magnetizing the magnetic substance film is performed under a condition of the second pressure, the temperature of the substrate and the magnetic field within the process container which are regulated in the regulating the internal pressure of the process container from the first pressure to the second pressure.

2. The semiconductor device manufacturing method of claim 1, wherein the second pressure falls within a range of 0.1 Pa to 100 kPa.

3. The semiconductor device manufacturing method of claim 1, wherein the second pressure falls within a range of 100 Pa to 100 kPa.

4. The semiconductor device manufacturing method of claim 1, wherein the step of magnetizing includes applying the magnetic field to the magnetic substance film while heating the magnetic substance film.

5. The semiconductor device manufacturing method of claim 1, wherein the step of magnetizing includes supplying an inert gas into the process container.

6. The semiconductor device manufacturing method of claim 1, wherein the step of loading includes loading the substrate into the process container while vertically holding the substrate by a substrate holder.

7. The semiconductor device manufacturing method of claim 1, wherein the step of loading includes loading the substrate into the process container while horizontally holding the substrate by a substrate holder.

8. The semiconductor device manufacturing method of claim 1, wherein the first pressure is within a range from 100 µPa to less than 0.1 Pa.

* * * * *